(12) United States Patent
Nagakura

(10) Patent No.: US 11,101,659 B2
(45) Date of Patent: Aug. 24, 2021

(54) DETECTION DEVICE, POWER CONDITIONER, DETECTION METHOD, AND STORAGE MEDIUM

(71) Applicant: FUJI ELECTRIC CO., LTD., Kanagawa (JP)

(72) Inventor: Takayuki Nagakura, Yokohama (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 25 days.

(21) Appl. No.: 16/524,216

(22) Filed: Jul. 29, 2019

(65) Prior Publication Data

US 2020/0091723 A1 Mar. 19, 2020

(30) Foreign Application Priority Data

Sep. 19, 2018 (JP) .............................. JP2018-174842

(51) Int. Cl.
 *H02J 3/38* (2006.01)
 *G01R 31/42* (2006.01)

(52) U.S. Cl.
 CPC .............. *H02J 3/381* (2013.01); *G01R 31/42* (2013.01); *H02J 3/388* (2020.01)

(58) Field of Classification Search
 CPC ... H02J 3/381; H02J 3/388; H02J 3/16; G01R 31/42
 See application file for complete search history.

(56) References Cited

U.S. PATENT DOCUMENTS

| 2005/0275979 | A1* | 12/2005 | Xu | .......................... | H02J 3/38 361/20 |
| 2008/0100145 | A1* | 5/2008 | Ito | .......................... | H02J 3/38 307/125 |
| 2013/0077367 | A1* | 3/2013 | Zhu | .......................... | H02J 3/16 363/97 |
| 2018/0095123 | A1* | 4/2018 | Biswas | ................ | G01R 31/088 |
| 2019/0199099 | A1 | 6/2019 | Nagakura | | |

FOREIGN PATENT DOCUMENTS

| JP | 2017022800 A | 1/2017 |
| JP | 2017028938 A | 2/2017 |
| JP | 6160790 B1 | 7/2017 |
| JP | 2017127044 A | 7/2017 |
| JP | 2017229198 A | 12/2017 |

\* cited by examiner

*Primary Examiner* — Hal Kaplan
*Assistant Examiner* — Thai H Tran

(57) ABSTRACT

A detection device includes a first detection unit that detects whether a power source may be in an islanding operation based on a frequency of an power supplied from a power source connected to a system, a power processing unit that changes the amount of power supplied from the power supply to the system in response to that the first detection unit detects that the power source may be in the islanding operation, a second detection unit that detects a voltage of a system with the power supply amount having been changed, and a disconnection processing unit that determines whether to disconnect a power source from a system in response to a change in a voltage of a system with the power supply amount having been changed.

16 Claims, 7 Drawing Sheets

DETECTION DEVICE, POWER CONDITIONER, DETECTION METHOD, AND STORAGE MEDIUM

The contents of the following Japanese patent application are incorporated herein by reference:
NO. 2018-174842 filed on Sep. 19, 2018

BACKGROUND

1. Technical Field

The present invention relates to a detection device, a power conditioner, a detection method, and a storage medium.

2. Related Art

Conventionally, in an grid interconnection system in which a distributed power supply such as photovoltaic solar system is connected to a grid power supply, an islanding operation detection system is known to detect that the distributed power supply is in the islanding operation state due to a power outage of the grid power supply (refer to for example, Patent Document 1). Further, in a similar islanding operation detection system, a technology is known which reduces an erroneous detection of an islanding operation state (refer to, for example, Patent Documents 2 to 4). Further, in a similar islanding operation detection system, a technology is known which reduces an output recovery time when the islanding operation state is erroneously detected (refer to, for example, Patent Document 5). Patent Document 1 Japanese Patent No. 6160790

Patent Document 2 Japanese Patent Application Publication No. 2017-127044

Patent Document 3 Japanese Patent Application Publication No. 2017-028938

Patent Document 4 Japanese Patent Application Publication No. 2017-022800

Patent Document 5 Japanese Patent Application Publication No. 2017-229198

In an area where the frequency of the power path is easily affected by the disturbance such as the area far from the electric main line that serves as the core, even if there is no power outage in the grid power supply, the frequency variation frequently occurs and the islanding operation detection system sometimes erroneously detects that the power source is in the islanding operation state and disconnects the distributed power supply from the grid power supply.

SUMMARY

In the first aspect of the present invention, the detection device is provided. The detection device may include a first detection unit that detects whether the power source may be in the islanding operation based on the frequency of the power supplied from the power source connected to the system. The detection device may include a power processing unit that changes the amount of power supplied from the power supply to the system in response to that the first detection unit detects that the power source may be in the islanding operation. The detection device may include a second detection unit that detects the voltage of the system with the power supply amount having been changed. The detection device may include a disconnection processing unit that determines whether to disconnect the power source from the system in response to the change in the voltage of the system with the power supply amount having been changed.

The power processing unit may reduce the amount of power supplied from the power supply to the system in response to that the first detection unit detects that the power source may be in the islanding operation.

The power processing unit may reduce the amount of power supplied from the power supply to the system by increasing the power for charging a power storage device connected between the power source and the system.

The disconnection processing unit may determine to disconnect the power source from the system if a voltage of the system with the power supply amount is reduced is equal to or below the reference.

A reference may be a voltage value according to a settling value of the under voltage that is predesignated by electricity supplier of the system to a load to which the power is supplied from the system.

A reference may be a voltage value of the system detected by the second detection unit with the power source not being disconnected from the system and the power being not supplied from the power source to the system.

The disconnection processing unit may determine to disconnect the power source from the system when the amount of change per unit time of the voltage of the system with the power supply amount having been changed is equal to or greater than the reference.

The power processing unit may return a state of the power supply amount to a state before the changing when the disconnection processing unit determines not to disconnect the power source from the system.

The detection device may further include a first warning processing unit that sends a warning signal when the disconnection processing unit determines not to disconnect the power source from the system.

The first warning processing unit may acquire a waveform of a frequency of the power supplied from the power source, that has caused the change in the power supply amount and give the waveform of the frequency to the warning signal.

The power processing unit may gradually change the amount of power supplied from the power supply to the system.

The detection device may further include a second warning processing unit that sends a warning signal to warn a possibility of disconnecting the power source from the system under one of the following conditions: detection that the power source may be in the islanding operation or a fact that a variation of the power supply amount that is changed in response to that the first detection unit detects that the power source may be in the islanding operation becomes equal to or greater than a reference.

The power processing unit changes the amount of power supplied from the power supply to the system a plurality of times within a predetermined period in response to that the first detection unit detects that the power source may be in the islanding operation.

The detection device may further include an instruction processing unit that transmits an instruction for changing a power supply amount from another power source to the system to a power converter that is provided between another power source connected to the system and the system in association with a change in the power supply amount by the power processing unit in response to that the first detection unit detects that the power source may be in the islanding operation.

In a second aspect of the present invention, a power conditioner is provided that includes a power conversion unit that converts an power from the distributed power supply into an AC current according to a grid power supply and the above-mentioned detection device.

In a third aspect of the present invention, a detection method is provided. The detection method may include a first detection stage in which a detection device detects whether the power source may be in the islanding operation based on a frequency of an power supplied from a power source connected to a system. The detection method may include a power processing stage in which the detection device changes a power supply from amount the power source to the system in response to that the first detection unit detects that the power source may be in the islanding operation. The detection method may include a second detection stage in which the detection device detects a voltage of the system with the power supply amount having been changed. The detection method may include a disconnection processing stage in which the detection device determines whether to disconnect the power source from the system in response to a change in a voltage of the system with the power supply amount having been changed.

In a fourth aspect of the present invention, a computer readable storage medium is provided. A storage medium may store a computer program for causing a computer to execute a first detection step for detecting whether the power source may be in the islanding operation based on a frequency of a power supplied from a power source connected to a system. A storage medium may store a computer program for causing a computer to execute a power processing step for changing a power supply amount from the power source to the system in response to that the first detection unit detects that the power source may be in the islanding operation. A storage medium may store a computer program for causing a computer to execute a second detection step for detecting a voltage of the system with the power supply amount having been changed. A storage medium may store a computer program for causing a computer to execute a disconnection processing step for determining whether to disconnect the power source from the system in response to a change in a voltage of the system with the power supply amount having been changed.

The summary clause does not necessarily describe all necessary characteristics of the embodiments of the present invention. The present invention may also be a sub-combination of the characteristics described above.

DESCRIPTION OF EXEMPLARY EMBODIMENTS

Although the present invention is described below with reference to embodiments of the invention, the following embodiments below do not limit the invention according to CLAIM. Further, not entire combinations of characteristics described in the embodiments is essential to the solution of the invention.

Figure 1:
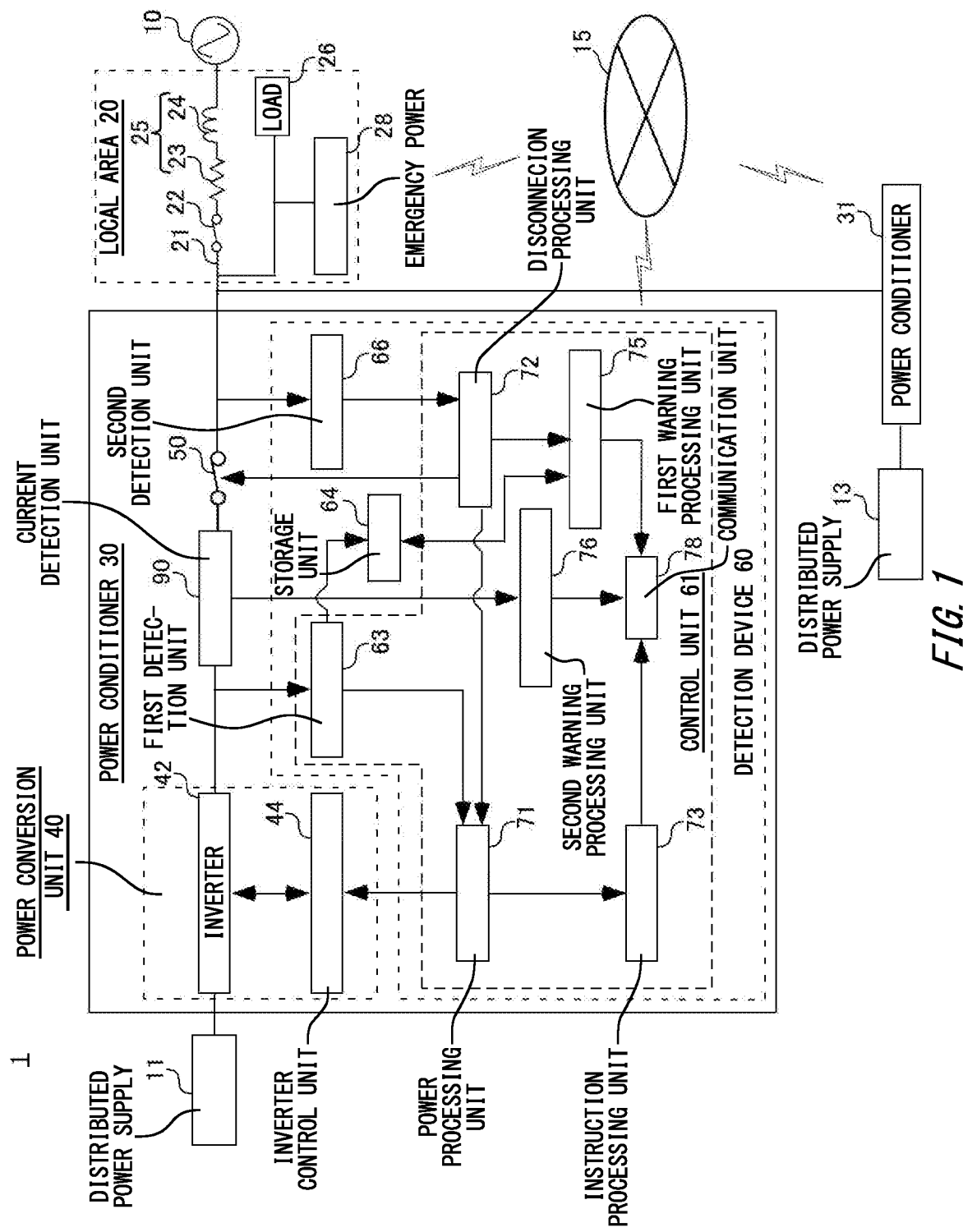
FIG. 1 illustrates a configuration of a grid interconnection system 1 according to the present embodiment.

FIG. 1 illustrates a configuration of the grid interconnection system 1 according to the present embodiment. The grid interconnection system 1 includes a grid power supply 10 that is included in the electric power system supplied by an electricity supplier or the like; one or more distributed power supplies 11, 13 such as a photovoltaic solar system, a wind generator system, and a fuel cell power generation system, which distributed power supplies 11, 13 are connected to a local area 20 which makes up at least a part of the electric power system and are linked to the grid power supply 10; and one or more power conditioners 30, 31 that are respectively provided between the grid power supply 10 and the distributed power supply 11 and between the grid power supply 10 and the distributed power supply 13, apply conversion to the power from the distributed power supplies 11, 13, and supply the converted power to the grid power supply 10.

The grid power supply 10 is equipment for supplying the power provided by the electricity supplier who manages the electric power system, and as one example, the grid power supply 10 may be, an electric generation plant, an electric power substation, or a transformer. The local area 20 includes the wiring, the load and the distributed power supply and the like connected to the end side of the grid power supply 10 in the electric power system. As one example, the local area 20 is located in the land positioned in the branch line of the end of the electric power system where the population is small and there is small demand for the power, and in the local area 20, solar power generation equipment using many solar panels as one example of the distributed power supplies 11, 13 can be provided. In such an area, since relatively large distributed power supplies 11, 13 can be connected to the branch line of the end of the electric power system, the fluctuation easily occurs. In the present embodiment, as one example, to the power line 21 between the power conditioners 30, 31 and the grid power supply 10, the system side circuit breaker 22 is provided which is disconnected in a case of the accident power outage, the planned power outage, and the maintenance power outage of the electric power system. Also, as one example, a load 26 and an emergency power 28 are connected to a power line 21. Note that the power line 21 includes a line impedance 25 including unintentional resistance 23 and inductance 24.

If the power conditioner 30 detects that the supply of the power from the grid power supply 10 is disconnected due to the accident power outage, the planned power outage, and the maintenance power outage of the electric power system, the grid power supply 10 side is isolated from the electric power system, and the distributed power supply 11 may be in the islanding operation state, the power conditioner 30 changes the power supply amount from the distributed power supply 11 to the system power supply grid power supply 10 side. The power conditioner 30 further detects the voltage of the grid power supply 10 side with the power supply amount having been changed based on the change in the voltage of the grid power supply 10 side, confirms whether the power source is in the islanding operation state, and determines whether to isolate the distributed power supply 11 from the grid power supply 10 side. The power conditioner 30 according to the present embodiment, as one example, isolates the distributed power supply 11 from the grid power supply 10 side when the voltage of the grid power supply 10 side is reduced to be equal to or below the reference as a result of the decrease in the power supply amount.

In this manner, if the power conditioner 30 detects the occurrence of the possible islanding operation event which requires the confirmation as to whether the power source is in the islanding operation state, the power conditioner 30 determines whether the islanding operation can be correctly detected or erroneously detected, and isolates the distributed power supply 11 from the grid power supply 10 side only when the islanding operation can be correctly detected. Thereby, the power conditioner 30 can be prevented from isolating the distributed power supply 11 from the grid power supply 10 side due to the erroneous detection of the islanding operation. Further the power conditioner 30 can ensure the safety of the work and inspection on the grid power supply 10 side and/or protect the power distribution facility on the grid power supply 10 side. The power conditioner 30 includes a power conversion unit 40, an interconnection relay 50, a detection device 60, and a current detection unit 90 for detecting the current output from the distributed power supply 11 to the grid power supply 10 side.

The power conversion unit 40 includes an inverter 42 and an inverter control unit 44 and converts the power from the distributed power supply 11 into the AC power compatible with the grid power supply 10. The inverter 42 converts the DC power or the AC power from the distributed power supply 11 into the AC power suitable for the electric power system and outputs the thus obtained AC power. The inverter control unit 44 controls the inverter 42 to match the voltage, frequency, and phase of the AC power output by the inverter 42 to those of the power on the side of the electric power system.

The interconnection relay 50 is a switch that is provided between the power conversion unit 40 and the grid power supply 10 side. The interconnection relay 50 is controlled by the detection device 60 and connects or disconnects the power conversion unit 40 to/from the grid power supply 10 side. Thereby, the interconnection relay 50 switches whether to connect the power conversion unit 40 on the distributed power supply 11 side with the grid power supply 10 side and connect the distributed power supply 11 to the electric power system. Although the power conditioner 30 according to the present embodiment is configured to incorporate the interconnection relay 50, instead, the power conditioner 30 may have the interconnection relay 50 at the outside thereof.

When detecting the occurrence of the possible islanding operation event, the detection device 60 determines whether the islanding operation can be correctly detected or erroneously detected and switches a state of the interconnection relay 50 to the disconnected state only when the islanding operation can be correctly detected. The detection device 60 according to the present embodiment injects reactive power to the power path between the power conversion unit 40 and the grid power supply 10 side and when the power source is in the islanding operation, by use of the large change in the frequency of the source power by the affect of the reactive power injection, detects whether the power source may be in the islanding operation. The detection device 60 according to the present embodiment includes a control unit 61, a storage unit 64, and a second detection unit 66 that detects the voltage of the grid power supply 10 side.

The control unit 61 according to the present embodiment includes a first detection unit 63, a power processing unit 71, a disconnection processing unit 72, an instruction processing unit 73, a first warning processing unit 75, a second warning processing unit 76, and a communication unit 78. The control unit 61 is a control computer that includes a CPU such as a microcontroller and functions as the units described below by executing the detection program. Alternatively, the control unit 61 may be realized by a dedicated circuit or programmable circuit The first detection unit 63 detects the frequency of the power supplied from the distributed power supply 11, and based on the detected frequency, detects whether the distributed power supply 11 may possibly be in the islanding operation. More specifically, the first detection unit 63 calculates a frequency parameter according to the frequency of the power supplied from the distributed power supply 11 calculates the deviation parameter according to the frequency deviation based on the frequency parameter in a certain period (first period) and the frequency parameter in a second period that is previous to the first period, and detects whether the distributed power supply 11 may possibly be in the islanding operation based on the deviation parameter.

For example, the first detection unit 63 detects the voltage of the power path between the power conversion unit 40 and the grid power supply 10 side and calculates the frequency of the source power as one example of the frequency parameter from the change in the voltage. Alternatively, the first detection unit 63 may detect the current flowing through the wiring to calculate the frequency parameter. The first detection unit 63 can use, as the frequency parameter, the cycle instead of using the frequency. Since the cycle is nothing more or less than the inverse number of the frequency, a person skilled in the art can understand that a configuration of using the cycle as the frequency parameter is substantially described herein. Further, the frequency parameter may not be the frequency or cycle itself, but may be a value that changes according to the frequency or cycle.

Further, the first detection unit 63 calculates, from the sequence of the calculated frequency parameters, a representative value of a plurality of frequency parameters in the first period of a predetermined duration corresponding to the current period and a representative value of a plurality of frequency parameters in the second period of the predetermined duration corresponding to the past period. The representative values of the first period and the second period may be moving average deviations of the frequency parameters of the first period and the second period as one example. The first period and the second period may be continuous with each other, may be separated from each other, or may partially overlap. The lengths of the first period and the second period may be either identical or different.

Further, the first detection unit 63 calculates a deviation between the representative values of the frequency parameters in the first period and the second period, i.e., for example, calculates the deviation parameter according to the frequency deviation, which deviation parameter is obtained by the first detection unit 63 subtracting the representative value of the frequency parameters in the second period from the representative value of the frequency parameters in the first period. When a change that is equal to or greater than the reference is detected in the deviation parameter, the first detection unit 63 determines that the distributed power supply 11 may possibly isolately supply the source power. The deviation parameter may be the cycle deviation, a value that changes according to the cycle deviation or the like. When the grid power supply 10 supplies the multiphase AC power, the frequency parameter and the deviation parameter may be calculated for all phases of AC current or for any single phase AC power.

The first detection unit 63 outputs the calculated deviation parameter to the power processing unit 71. When the first detection unit 63 detects that the distributed power supply 11 may possibly be in the islanding operation, the first detection unit 63 outputs the detection result to the power processing unit 71. When detecting that the distributed power supply 11 may be in the islanding operation, as one example, the first detection unit 63 stores, to the storage unit 64, the waveform of the frequency that has caused the detection. The first detection unit 63 does not need to store the waveform of the frequency to the storage unit 64.

The power processing unit 71 receives the deviation parameter from the first detection unit 63 and injects reactive power corresponding to the received deviation parameter to the power path. The power processing unit 71 calculates the amount of the reactive energy to be output according to the reactive power output characteristic used for detecting the islanding operation state of the distributed power supply 11.

The reactive power output characteristic is the relationship between the deviation parameter and the reactive energy to be injected to detect the island operation state. In the present embodiment, the reactive power output characteristic is adjustable. In the present embodiment, as one example, the power processing unit 71 adjusts one or more parameters expressing the reactive power output characteristic. However, the power processing unit 71 may select any reactive power output characteristic from among a plurality of reactive power output characteristics to be used. The power processing unit 71 supplies the reactive energy to be output, to the inverter control unit 44.

The power processing unit 71 changes the power supply amount from the distributed power supply 11 to the system power supply grid power supply 10 side in response to the detection by the first detection unit 63 that the distributed power supply 11 may be in the islanding operation. As one example, the power processing unit 71 according to the present embodiment reduces the power supply amount from the distributed power supply 11 to the grid power supply 10 side in response to the detection by the first detection unit 63 that the distributed power supply 11 may be in the islanding operation.

More specifically, in response to the detection that the distributed power supply 11 may be in the islanding operation, the power processing unit 71 outputs an instruction to the inverter control unit 44 to reduce the supply amount of the power output by the inverter 42 from the distributed power supply 11 to the grid power supply 10 side. As one example, the power processing unit 71 according to the present embodiment outputs an instruction to the inverter control unit 44 to reduce the instruction value of the current output by the inverter 42 from the distributed power supply 11 to the grid power supply 10 side. In response to the detection that the distributed power supply 11 may be in the islanding operation, the power processing unit 71 may set the power supply amount from the distributed power supply 11 to the system power supply grid power supply 10 side to zero.

As one example, the inverter 42 includes a capacitor and may reduce or set to zero the current output from the distributed power supply 11 to the grid power supply 10 side by outputting a counter voltage from the capacitor to the distributed power supply 11 side. Thereby, it is possible to prevent the stop of the operation of the distributed power supply 11 that is caused by the back-flow of the electricity to the distributed power supply 11 side and the increase of the voltage of the distributed power supply 11 side.

After changing the power supply amount from the distributed power supply 11 to the system power supply grid power supply 10 side, the power processing unit 71 returns a state of the changed power supply amount to a state before the changing if it is determined that the interconnection relay 50 is not switched to the disconnected state, i.e., if it is determined that the distributed power supply 11 is not disconnected from the grid power supply 10 side. When it is determined that the distributed power supply 11 is not disconnected from the grid power supply 10 side, as one example, the power processing unit 71 according to the present embodiment returns a state of the reduced power supply amount to a state in which the power supply is not yet reduced. More specifically, when it is determined that the distributed power supply 11 is not disconnected from the grid power supply 10 side, the power processing unit 71 outputs the instruction to the inverter control unit 44 to return a state to the state in which the supply amount of the power output by the inverter 42 from the distributed power supply 11 to the grid power supply 10 side is not yet reduced.

Further, when changing the power supply amount from the distributed power supply 11 to the system power supply grid power supply 10 side in response to the detection by the first detection unit 63 that the distributed power supply 11 may be in the islanding operation, the power processing unit 71 outputs, to the instruction processing unit 73, the information on the change in the power supply amount. As one example, the information includes the amount and timing of the change in the amount of the power supplied from the distributed power supply 11 to the system power source 10 side. When it is determined that the distributed power supply 11 is disconnected from the grid power supply 10 side after the power supply amount from the distributed power supply 11 to the system power supply grid power supply 10 side is changed, the power processing unit 71 outputs, to the instruction processing unit 73, the information indicating the determination on the disconnection. When it is determined that the distributed power supply 11 is not disconnected from the grid power supply 10 side after the power supply amount from the distributed power supply 11 to the system power supply grid power supply 10 side is changed, the power processing unit 71 outputs information indicating the determination on non-disconnection to the instruction processing unit 73.

The disconnection processing unit 72 receives a value of a voltage of the grid power supply 10 side detected by the second detection unit 66. The disconnection processing unit 72 determines whether to switch the interconnection relay 50 to the disconnected state, i.e., whether to disconnect the distributed power supply 11 from the grid power supply 10 side according to the change of the voltage of the grid power supply 10 side with the power supply amount having been changed. As one example, the disconnection processing unit 72 according to the present embodiment determines to disconnect the distributed power supply 11 from the grid power supply 10 side if the voltage of the grid power supply 10 side with the power supply amount has been reduced becomes equal to or below the reference.

When the distributed power supply 11 is in the islanding operation state, the voltage of the grid power supply 10 side decreases to follow the decrease of the power supply amount from the distributed power supply 11 to the system power supply grid power supply 10 side. On the other hand, when the distributed power supply 11 is not in the islanding operation, the voltage of the grid power supply 10 side does slightly decrease in response to the decrease in the amount of the power supplied from the distributed power supply 11 to the system power source 10 side, but the decrease is almost negligible and much smaller than when the distributed power supply 11 is in the islanding operation. Therefore, the disconnection processing unit 72 determines whether to disconnect the distributed power supply 11 from the grid power supply 10 side by using the voltage value of the grid power supply 10 side below the reference when the distributed power supply 11 is in the islanding operation state and using the voltage value not below the reference when the distributed power supply 11 is not in the islanding operation state.

The AC current flows through the power path at which the second detection unit 66 detects the voltage. Therefore, as one example, the disconnection processing unit 72 according to the present embodiment may, compare with the above reference, with the effective voltage value of each of three phases or the maximum value of the instantaneous voltage of each of three phases detected by the second detection unit 66. As compared with the above-mentioned reference, when using the effective voltage value of each of three phases, the disconnection processing unit 72 may specify the effective voltage value of each of three phases by knowing at what time point in the cycle the above-mentioned determination is made during the temporal change of the voltage value of each phase, i.e., by knowing, for example, that the voltage value varies with the cycle of 20 ms when the AC frequency is 50 Hz and that the above-mentioned determination is made when 5 msec elapses from the start of the particular one cycle. The disconnection processing unit 72 preferably observes the change in the voltage of the grid power supply 10 side at least during the period of 1 cycle or more of the AC current voltage.

In the present embodiment, as one example of the above-mentioned reference, the disconnection processing unit 72 uses the voltage value corresponding to a settling value of the under voltage that is predesignated by an electricity supplier of the grid power supply 10 to a load 26 to which the power is supplied from the grid power supply 10. The settling value may sometimes be referred to as the set value. As one example, it is a duty for the electricity supplier to maintain the voltage value of the power supplied from the grid power supply 10 to the load 26 within ±5% of normal in the case of 100V system and maintain the voltage value within ±10% of normal in the case of 200V system. In this case, as one example of the settling value of the above-mentioned under voltage, the electricity supplier designates the load 26 90% of normal in the case of 100V system and 80% of normal in the case of 200V system. Therefore, as the above mentioned reference, the disconnection processing unit 72 may use 90% of the voltage values of the grid power supply 10 side detected by the second detection unit 66 with the first detection unit 63 does not detect that the distributed power supply 11 may be in the islanding operation, when the grid power supply 10 is the 100V system and use 80% of the voltage values of the grid power supply 10 side when the grid power supply 10 is the 200V system.

When the voltage of the grid power supply 10 side becomes equal to or less than the voltage value according to the settling value of the above-mentioned under voltage and the disconnection processing unit 72 determines to disconnect the distributed power supply 11 from the grid power supply 10 side with the power supply amount is reduced, the disconnection processing unit 72 outputs a signal indicating the disconnection determination to the power processing unit 71 and causes the interconnection relay 50 to the disconnected state. In this case, the disconnection processing unit 72 may cause the interconnection relay 50 to the disconnected state in response to the detection by the current detection unit 90 that the current output from the distributed power supply 11 to the grid power supply 10 side becomes zero.

If the disconnection processing unit 72 determines not to disconnect the distributed power supply 11 from the grid power supply 10 side because, for example, within a predetermined time after the reduction of the power supply amount from the distributed power supply 11 to the system power supply grid power supply 10 side is started by the power conversion unit 40, the voltage of the grid power supply 10 side with the power supply amount is reduced with the power supply amount is reduced is not equal to or less than the voltage value according to the settling value of the above-mentioned under voltage, the disconnection processing unit 72 leaves the interconnection relay 50 in the connected state and outputs the signal indicating the non-disconnection determination to the power processing unit 71 and the first warning processing unit 75.

In response to the detection that the distributed power supply 11 may be in the islanding operation, the instruction processing unit 73 transmits the instruction to change the power supply amount from the distributed power supply 13 to the grid power supply 10 side toward the power conditioner 31 as one example of another power converter provided between the distributed power supply 13 as one example of another distributed power supply connected to the grid power supply 10 and the grid power supply 10 by linking to the change in the power supply amount by the power processing unit 71. More specifically, the instruction processing unit 73 receives, from the power processing unit 71, the information on the change on the above-described power supply amount and transmits via the communication unit 78 to the power conditioner 31, the information content, i.e., for example, the instruction to change the power supply amount from the distributed power supply 13 to the grid power supply 10 side by linking to the variation and the change timing of power supply amount from the distributed power supply 11 to the grid power supply 10 side.

Further, the instruction processing unit 73 receives, from the power processing unit 71, the information on the determination that the distributed power supply 11 is not disconnected from the grid power supply 10 side after the power supply amount from the distributed power supply 11 to the system power supply grid power supply 10 side is changed and transmits via the communication unit 78 to the power conditioner 31, the instruction to return a state in which the power supply amount from the distributed power supply 13 to the grid power supply 10 side is changed to a state before the changing. Further, the instruction processing unit 73 receives, from the power processing unit 71, the information on the determination that the distributed power supply 11 is disconnected from the grid power supply 10 side after the power supply amount from the distributed power supply 11 to the system power supply grid power supply 10 side is changed, and transmits via the communication unit 78 to the power conditioner 31, the instruction to disconnect the distributed power supply 13 from the grid power supply 10 side.

The first warning processing unit 75 sends the warning signal when the disconnection processing unit 72 determines not to disconnect the distributed power supply 11 from the grid power supply 10 side. More specifically, the first warning processing unit 75 receives, from the disconnection processing unit 72, the signal indicating the determination that the distributed power supply 11 is not disconnected from the grid power supply 10 side and then, transmits the warning signal to the communication equipment of the electricity supplier via the communication unit 78. As one example, the first warning processing unit 75 according to the present embodiment acquires, from the storage unit 64, the waveform of the frequency of the power supplied from the distributed power supply 11 that has caused the change in the power supply amount and gives the waveform of the frequency to the above-mentioned warning signal. Note that, the first warning processing unit 75 may only send the warning signal without acquiring the waveform of the frequency from the storage unit 64.

The first warning processing unit 75 can notify the electricity supplier the occurrence of the erroneous detection of the islanding operation at the power conditioner 30 by sending, to the communication equipment of the electricity supplier, the warning signal, the frequency waveform that has caused the erroneous detection and the like. Thereby, for example, through the first warning processing unit 75, it is possible to ask the electricity supplier to adjust the setting inside the power conditioner 30 so that the erroneous detection is unlikely to occur in the power conditioner 30 or ask the electricity supplier to reduce the impedance of the electric power system and make the adjustment so that the frequency of the power path becomes the strong state and is unlikely to be affected by the disturbance.

As one example, adjusting the setting inside the power conditioner 30 includes the setting in which the injection amount of the reactive power to the power path is reduced and the frequency variation of the power path is observed for a longer period than the default, and setting in which the frequency of reducing the power supply amount is reduced by increasing the reference that is compared with the change in the above-described deviation parameter, which reference is used as one example of a condition for reducing the power supply amount.

The second warning processing unit 76 sends the warning signal to warn that the distributed power supply 11 side may be disconnected from the grid power supply 10 side when the variation of the power supply amount by the power conditioner 30 becomes equal to or greater than the reference in response to the detection that the distributed power supply 11 may be in the islanding operation. As one example, the second warning processing unit 76 according to the present embodiment receives, from the current detection unit 90, the current value output from the distributed power supply 11 to the grid power supply 10 side and transmits the warning signal to the communication equipment of the emergency power 28 of the local area 20 via the communication unit 78 in response to a fact that the current output from the distributed power supply 11 to the grid power supply 10 side is reduced to be equal to or greater than the reference.

Accordingly, the second warning processing unit 76 can send the warning signal to the communication equipment of the emergency power 28 at a timing faster than a timing at which the voltage of the grid power supply 10 side changes following the change in the power supply amount from the power conditioner 30 to the grid power supply 10 side. For example, when the load 26 is the important device that operates by receiving the power from the grid power supply 10 or the distributed power supply 11 and is not be allowed to unexpectedly stop the operation due to the power outage, the time to safely stop the operation of the load 26 and the time to switch the power supply source to the load 26 to the emergency power 28 is ensured until the power conditioner 30 in the islanding operation state stops the supply of the power to the load 26.

The communication unit 78 communicates with the communication equipment of the electricity supplier via the dedicated or general purpose communication network 15, receives various instructions from the communication equipment of the electricity supplier to the detection device 60, and transmits the warning signal input from the first warning processing unit 75 to the communication equipment of the electricity supplier. The communication unit 78 communicates with another power conditioner 31 via the communication network 15 and transmits the instruction input from the instruction processing unit 73 to the power conditioner 31. The communication unit 78 communicates with the communication equipment of the emergency power 28 of the local area 20 via the communication network 15 and transmits the warning signal input from the second warning processing unit 76 to the communication equipment of the emergency power 28.

Although the power conditioner 31 according to the present embodiment is the same as the power conditioner 30 by including the power conversion unit 40 and the interconnection relay 50, the power conditioner 31 differs from the power conditioner 30 by not including the detection device 60 and the current detection unit 90. Since the power conversion unit 40 and the interconnection relay 50 of the power conditioner 30 included in the power conditioner 31 have the same functions as the power conversion unit 40 and the interconnection relay 50 respectively, the duplicated description is omitted.

The power conditioner 31 further includes the communication unit that outputs the instruction to the configuration corresponding to the inverter control unit 44 of the power conversion unit 40 of the power conditioner 30 upon receiving the instruction from the instruction processing unit 73 of the power conditioner 30. The configuration corresponding to the inverter control unit 44 of the power conditioner 31 causes the distributed power supply 13 to be disconnected from the grid power supply 10 according to the instruction by changing the power supply amount from the distributed power supply 13 to the grid power supply 10 side, returning a state of the changed power supply to a state in which the power supply is not ye changed, and setting the configuration corresponding to the interconnection relay 50 to the disconnected state. In this manner, the power conditioner 31 does not conduct the above-mentioned plurality of processes based on its own judgement, but the power conditioner 31 conducts the above-mentioned plurality of processes based on the instruction from the power conditioner 30.

As one example, although the grid interconnection system 1 according to the present embodiment is configured to include the set of distributed power supply 11 and power conditioner 30 and the set of distributed power supply 13 and power conditioner 31 in the local area 20, the system may have only one set of distributed power supply 11 and power conditioner 30 or may have three or more sets of distributed power supply and power conditioner. When the grid interconnection system 1 includes three or more sets of distributed power supply and power conditioner, the system includes at least one set of distributed power supply 11 and power conditioner 30, and the power converter in other sets may be configured to have the same function as either one of the power conditioner 30 and the power conditioner 31.

The grid interconnection system 1 includes at least one power conditioner 30 and any number of power conditioners 31, and by operating any number of power conditioners 31 based on the instruction of the power conditioner 30, the changes of the power supply amount from each power conditioner to the grid power supply 10 side are generally synchronized and the changes can be controlled in the same manner.

When the changes of the power supply amount from each power conditioner to the grid power supply 10 side are controlled in the different manner, in a situation where, for example, each distributed power supply is blocked from the grid power supply 10 and is in the islanding operation state, the voltage of the grid power supply 10 side is unlikely to decrease and a fact that each distributed power supply is in the islanding operation state may not be correctly detected when another power conditioner increases the power supply amount even though at least power conditioner 30 decreases the power supply amount.

On the contrary, in the grid interconnection system 1, if the changes of the power supply amount from each power conditioner to the grid power supply 10 side are generally synchronized and the changes are controlled in the same manner, a fact that each distributed power supply is in the islanding operation state can be correctly detected.

Even if at least one power conditioner 30 and any number of power conditioners 31 control the timings so that the injection timing of the reactive power to the power path matches with the change timing of the power supply amount to the grid power supply 10 side, it is possible that the deviation occurs somehow in each timings, but if, for example, the AC frequency is 50 Hz and the frequency changes in 20 msec per cycle, it is considered that a fact that each distributed power supply is in the islanding operation state can be correctly detected if the deviation is about 20 msec per cycle.

Even if the at least one power conditioner 30 and any number of power conditioners 31 control the timings so that the injection timing of the reactive power to the power path matches with the change timing of the power supply amount to the grid power supply 10 side, when it is determined that each distributed power supply is disconnected from the grid power supply 10 because the effective voltage value of each phase of the AC current on the grid power supply 10 side is equal to or below the reference, it is possible that all power conditioners are not configured to detect the effective voltage value of the same phase in the AC current on the grid power supply 10 side as the unexpected situation. Even in such a case, when, for example, the AC frequency is 50 Hz and the frequency changes in 20 msec per cycle, since the deviation is within 20 msec per cycle, it is considered that a fact that each distributed power supply is in the islanding operation state can be correctly detected.

As one example, the power conditioner 30 according to the present embodiment adopts Japan Electrical Manufacturers Association (JEM) JEM1498 (Standard active islanding operation detection method of single-phase power conditioner for distributed power supply) and JEM1505 (Standard active islanding operation detection method for three-phase power conditioner for solar power generation connected to low-voltage power distribution line). Since the impedance of the electric power system is small and the number of generators by the rotating machine is large, the standard type islanding operation detection method is assumed to be used at an area where the frequency of the power path is unlikely to be affected by the disturbance. In this case, the frequency of the power path hardly changes except in the islanding operation state. However, if, for example, the local area 20 is far from the electric main line that serves as the core, since the impedance of the electric power system is large and the number of generators by the rotating machine is small, the frequency of the power path is likely to be affected by the disturbance, the frequency variation frequently occurs due to the reactive power injection even if the power outage does not occur to the grid power supply 10, and it is highly likely that the erroneous detection of the islanding operation occurs frequently.

When the grid power supply 10 is the high voltage of 50 kW or more or the special connection, and if the distributed power supply 11 is isolated from the grid power supply 10 side by erroneously detecting the islanding operation, for the reconnection, the power producer and the power company need to discuss and it takes time and effort. Even if the power conditioner includes the power storage device, since the power storage device may not store the rated amount or more of the electric power generated until the reconnection and needs to release the electric power, the power sale opportunity is missed.

On the contrary, the power conditioner 30 of the grid interconnection system 1 according to the present embodiment can enhance the detection accuracy of the islanding operation by detecting that the distributed power supply 11 may be in the islanding operation state, changing the power supply amount from the distributed power supply 11 to the grid power supply 10 side, detecting the voltage of the grid power supply 10 side with the power supply amount having been changed, and determining whether to isolate the distributed power supply 11 from the grid power supply 10 side based on the change in the voltage of the grid power supply 10 side. Thereby, the power conditioner 30 is prevented from isolating the distributed power supply 11 from the grid power supply 10 by erroneously detecting the islanding operation, the time required for the discussion between the power producer and the power company for the reconnection is reduced and missing of the power sale opportunity unnecessarily may be avoided.

Figure 2:
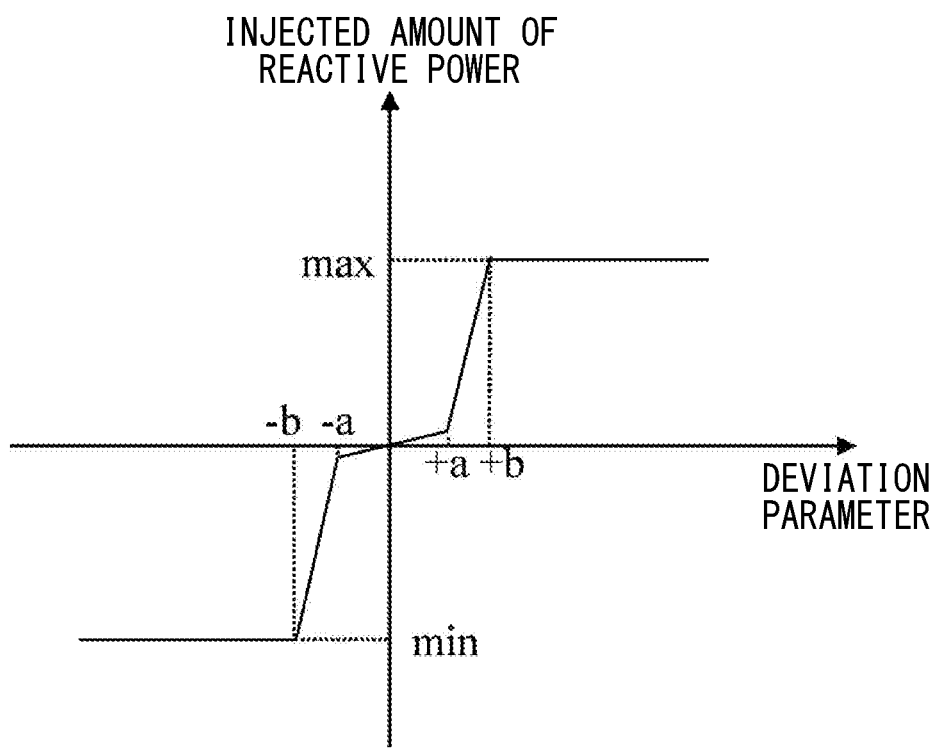
FIG. 2 illustrates one example of the relationship between a deviation parameter and an injected amount of reactive power according to the present embodiment.

FIG. 2 illustrates one example of the relationship between the deviation parameter and the injected amount of reactive power according to the present embodiment. The horizontal axis of FIG. 2 represents the deviation parameter to be received by the power processing unit 71 from the first detection unit 63 (as one example, frequency deviation) and the vertical axis represents the reactive power to be injected to the power path by the power processing unit 71. The power processing unit 71 calculates the reactive power to be injected from the graph of FIG. 2 based on the deviation parameter received from the first detection unit 63 and controls the power conversion unit 40 to inject the calculated reactive power to the power path. Accordingly, the power processing unit 71 injects the reactive power in the direction in which the deviation caused at the power path is promoted and makes it easy to detect the islanding operation state of the power source.

In the range where the deviation parameter is −a to +a, the power processing unit 71 controls the injection amount of the reactive current based on the deviation parameter to be relatively small. When the distributed power supply 11 is connected to the electric power system and the deviation between the distributed power supply and the electric power system is small, the power processing unit 71 injects the large reactive power to the power path and prevents the agitation of the electric power system. In the range where the deviation parameter is −b to −a and +a to +b, the power processing unit 71 controls the injection amount of the reactive power based on the deviation parameter to be relatively large The power processing unit 71 injects the relatively larger reactive power to the power path in response to the characteristic that the distributed power supply 11 is isolated from the electric power system and thus, the magnitude of the deviation parameter becomes "a" or more. Accordingly, the islanding operation state may be easily detected. In the range where the deviation parameter is −b or less or +b or more, the power processing unit 71 does not further increase the injection amount of the reactive power and maintains the minimum value or the maximum value. Accordingly, the power processing unit 71 is prevented from injecting the excessive reactive power to the power path.

Figure 3:
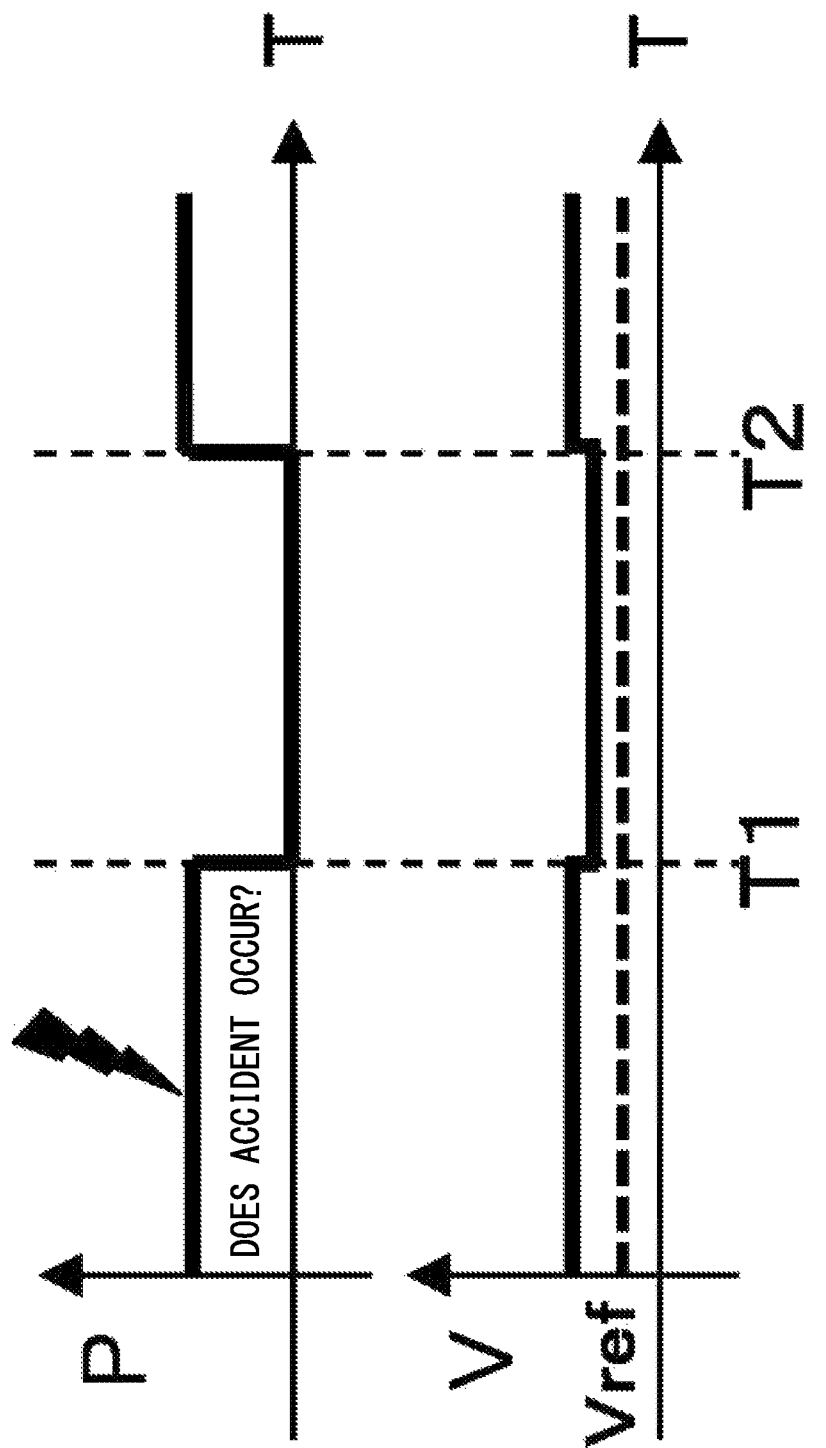
FIG. 3 illustrates one example of the temporal change in the power supply amount and the voltage when the power source is not in the islanding operation state according to the present embodiment.
Figure 4:
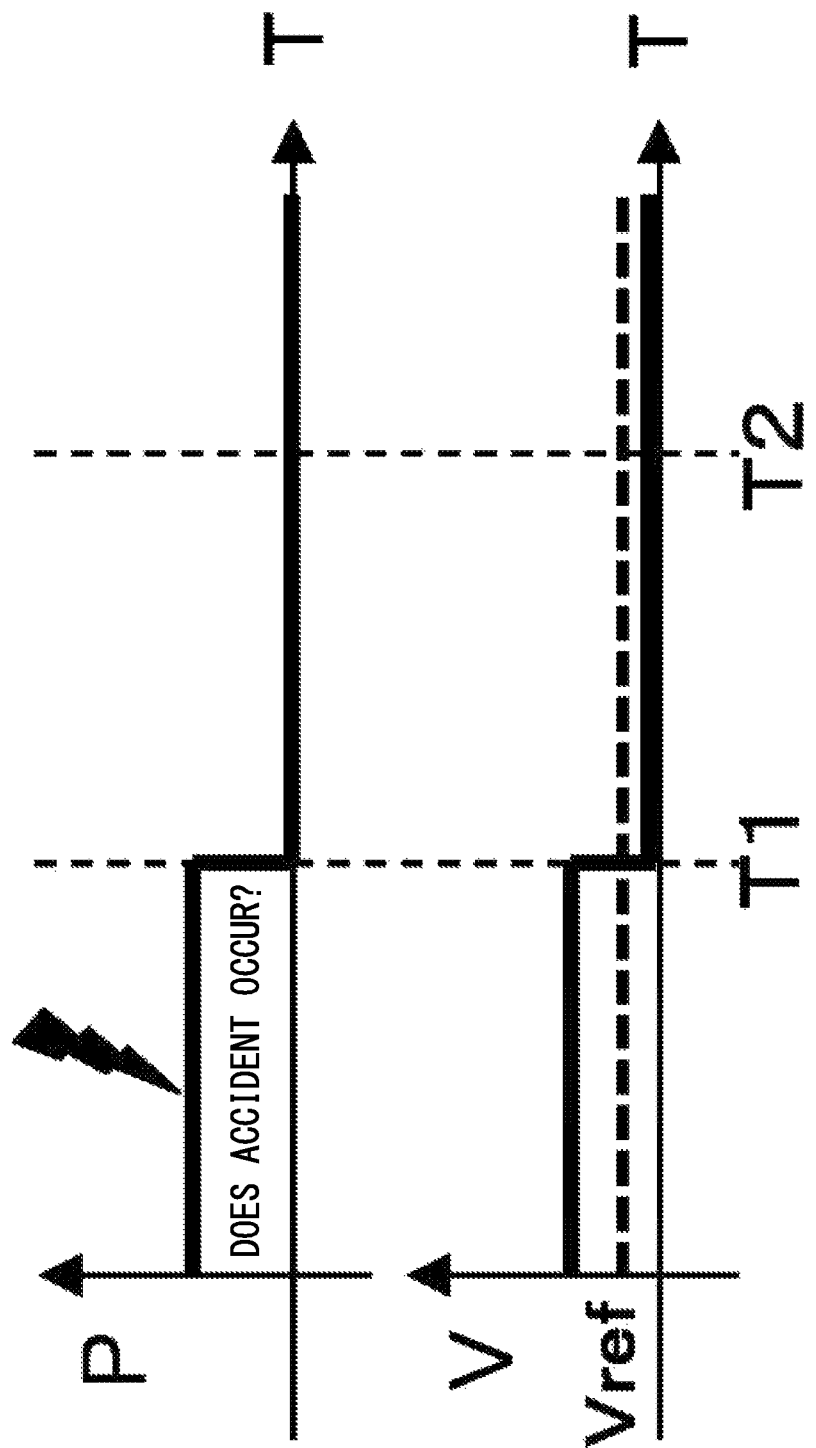
FIG. 4 illustrates one example of a temporal change of the power supply amount and the voltage when the power source is in the islanding operation state according to the present embodiment.

FIG. 3 illustrates one example of the temporal change of the power supply amount and the voltage according to the present embodiment when the power source is not in the islanding operation state and FIG. 4 illustrates one example of the temporal change of the power supply amount and the voltage according to the present embodiment when the power source is in the islanding operation state. Each drawing illustrates, from the upper side to the down side, a graph of the temporal change of the power supply amount from the distributed power supply 11 to the system power supply grid power supply 10 side and a graph of the temporal change of the voltage of the grid power supply 10 side and both graphs have the temporal sequence. In each drawing, the horizontal axis of the graph of the temporal change of the power supply amount represents the time (T) and the vertical axis represents the power supply amount (P) and the horizontal axis of the graph of the temporal change of the voltage represents the time (T) and the vertical axis represents the voltage (V). On the graph of the temporal change of the voltage in each drawing, the reference of the voltage of the grid power supply 10 side used by the disconnection processing unit 72 to determine whether to disconnect the distributed power supply 11 from the grid power supply 10 side is indicated as Vref. The power supply amount and the voltage illustrated in each drawing are represented as instantaneously changing for the purpose to clarify the explanation, but neither of them excludes the gradual change.

With reference to FIG. 3, before time T1, the accident power outage is caused to the electric power system, and the possibility that the supplies of the power from the grid power supply 10 is blocked, i.e., the event that suspects that the distributed power supply 11 is in the islanding operation state occurs, and a time T1, the power conditioner 30 detects that the distributed power supply 11 may be in the islanding operation state. Note that, the power conditioner 30 that employs the standard type islanding operation detection method detects the possibility in about 200 msec after the occurrence of the event.

As shown in the graph of FIG. 3, the power conditioner 30 according to the present embodiment, as one example, sets the power supply amount (P) from the distributed power supply 11 to the grid power supply 10 side to zero upon detecting at time T1, the distributed power supply 11 may be in the islanding operation state. When the distributed power supply 11 is not in the islanding operation state, as shown in the graph of FIG. 3, at time TN, the voltage (V) of the grid power supply 10 side slightly decreases in response to the decrease in the power supply amount from the distributed power supply 11 to the system power supply grid power supply 10 side, but does not decrease down to the reference Vref or below. The power conditioner 30 detects the voltage of the grid power supply 10 side with the power supply amount is set to zero, and at time T2, the power supply amount (P) that is set to zero is returned to the initial value before zeroing in response to a fact that the voltage of the grid power supply 10 side does not become equal to or less than the reference Vref during the time length from the time T1 to time T2. As shown in the down side graph of FIG. 3, at time T2, the voltage (V) of the grid power supply 10 side is returned to the initial value before decreasing.

With reference to FIG. 4. as similar to the above-mentioned description in FIG. 3, before time T1, the event occurs that suspects that the distributed power supply 11 may be in the islanding operation state, and at time T1, the power conditioner 30 detects that the distributed power supply 11 may be in the islanding operation state and as one example, sets the power supply amount (P) from the distributed power supply 11 to the grid power supply 10 side to zero.

When the distributed power supply 11 is in the islanding operation state, as compared to when the distributed power supply 11 is not in the islanding operation state, as shown in the down side graph of FIG. 4, at time T1, the voltage (V) of the grid power supply 10 side decreases significantly and becomes equal to or less than the reference Vref in response to the decrease in the power supply amount from the distributed power supply 11 to the system power supply grid power supply 10 side. The power conditioner 30 detects the voltage of the grid power supply 10 side with the power supply amount is set to zero, and at time T2, disconnects the distributed power supply 11 from the grid power supply 10 side in response to a fact that, for example, during a time length from time T1 to time T2, over at least one cycle or more of the AC current of the grid power supply 10, the voltage of the grid power supply 10 side is equal to or less than the reference Vref.

Figure 5:
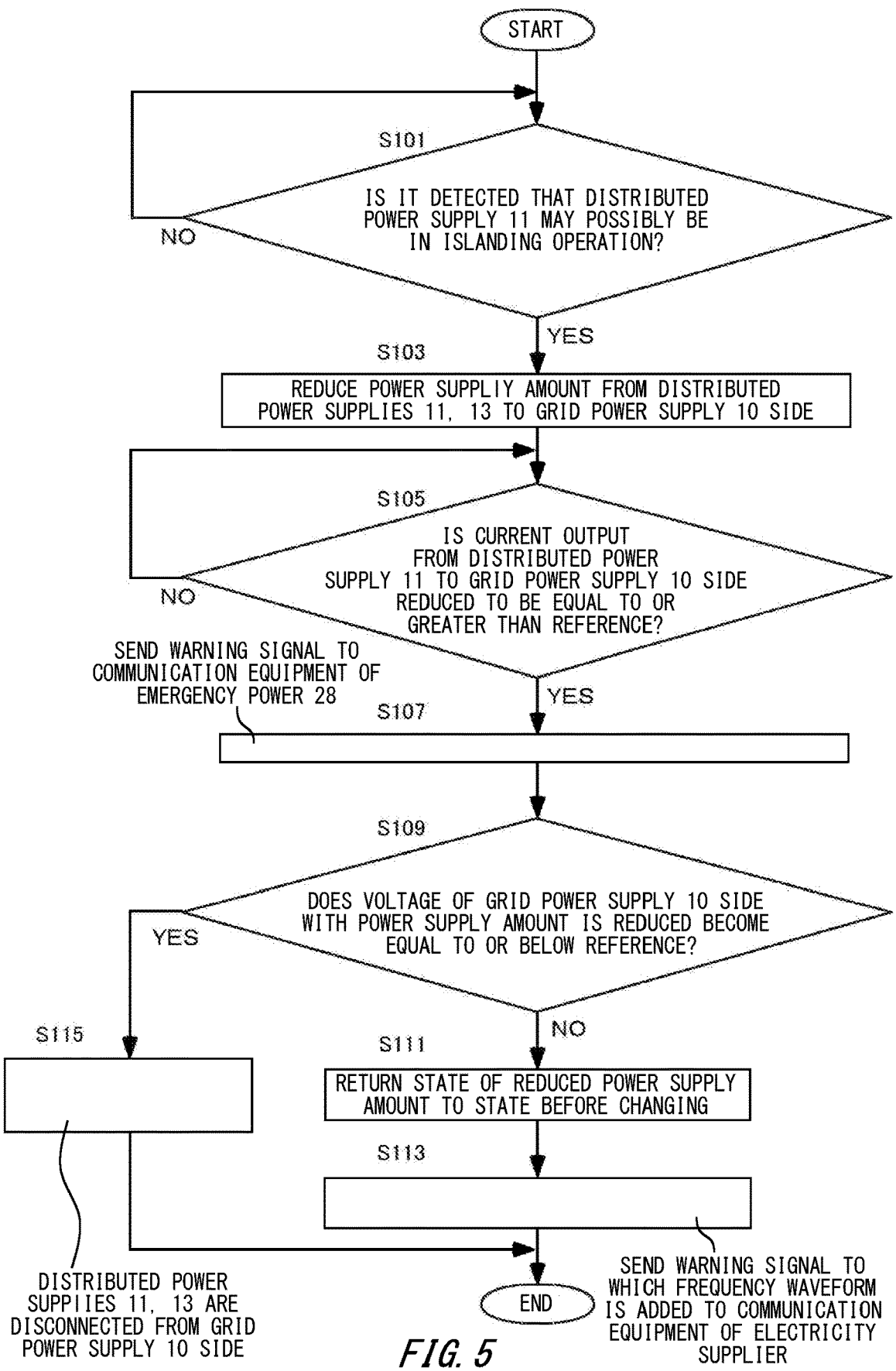
FIG. 5 illustrates an operation flow of a power conditioner 30 according to the present embodiment.

FIG. 5 illustrates the operation flow of the power conditioner 30 according to the present embodiment. The flow starts with a state in which, as one example, the power processing unit 71 does not change the power supply amount from the distributed power supply 11 to the system power supply grid power supply 10 side and the interconnection relay 50 is in the connected state.

The power processing unit 71 waits until the first detection unit 63 detects that the distributed power supply 11 may be in the islanding operation based on the frequency of the power supplied from the distributed power supply 11 (step S101: NO), when the first detection unit detects that the distributed power supply 11 may be in the islanding operation (step S101: YES), the power processing unit outputs the information on the change on the power supply amount to the instruction processing unit 73, thus, causes the power conditioner 31 and the power conditioner 30 to conduct the control approximately synchronously, and causes the inverter control unit of each power conditioner to conduct the control so that the power supplies from the distributed power supplies 11, 13 to the grid power supply 10 side are almost simultaneously reduced (step S103).

The second warning processing unit 76 receives, from the current detection unit 90, the current value output from the distributed power supply 11 to the grid power supply 10 side, waits until the variation of the power supply amount by the power conditioner 30 becomes equal to or greater than the reference, i.e., until the current output from the distributed power supply 11 to the grid power supply 10 side is reduced to be equal to or greater than the reference (step S105: NO), and sends the warning signal to the communication equipment of the emergency power 28 via the communication unit 78 in response to the fact that the current is reduced to be equal to or greater than the reference (step S107).

The second detection unit 66 detects the voltage of the grid power supply 10 side with at least the power supply is changed. The disconnection processing unit 72 receives, from the second detection unit 66, the voltage value of the grid power supply 10 side, and as one example, determines whether the voltage of the grid power supply 10 side with the power supply amount is reduced becomes equal to or below the reference within a predetermined time (step S109)

If the voltage of the grid power supply 10 side does not become equal to or below the reference within a predetermined time (step S109: NO), the disconnection processing unit 72 determines not to disconnect the distributed power supply 11 from the grid power supply 10 side and outputs the signal indicating the non-disconnection determination thereof to each of the power processing unit 71 and the first warning processing unit 75.

The power processing unit 71 receives, from the disconnection processing unit 72, the signal indicating non-disconnection, then, outputs the signal to the instruction processing unit 73, accordingly, causes the power conditioner 31 and the power conditioner 30 to conduct the control approximately synchronously, and causes the inverter control unit of each power conditioner to conduct the control so as to return a state of the reduced power supply amount to a state before changing (step S111).

The first warning processing unit 75 receives, from the disconnection processing unit 72, the signal indicating non-disconnection, then acquires, from the storage unit 64, the associated frequency waveform, gives the frequency waveform to the warning signal, and sends the warning signal to the communication equipment of the electricity supplier via the communication unit 78 (step S113). From the above, the flow ends. The flow is repeated as long as the power conditioner 30 keeps operating.

If at step S109, the voltage of the grid power supply 10 side becomes equal to or below the reference within a predetermined time (step S109: YES), the disconnection processing unit 72 determines to disconnect the distributed power supply 11 from the grid power supply 10 side, disconnects the distributed power supply 11 from the grid power supply 10 side by setting the interconnection relay 50 in the disconnected state, and outputs the signal indicating disconnection to the power processing unit 71. The power processing unit 71 outputs the signal to the instruction processing unit 73 in response to receiving the signal, accordingly, causes the power conditioner 31 and the power conditioner 30 to conduct the control approximately synchronously, and causes the power conditioner 31 to conduct the control so that the distributed power supply 13 is also disconnected from the grid power supply 10 side (step S115). Accordingly, the flow ends.

Figure 6:
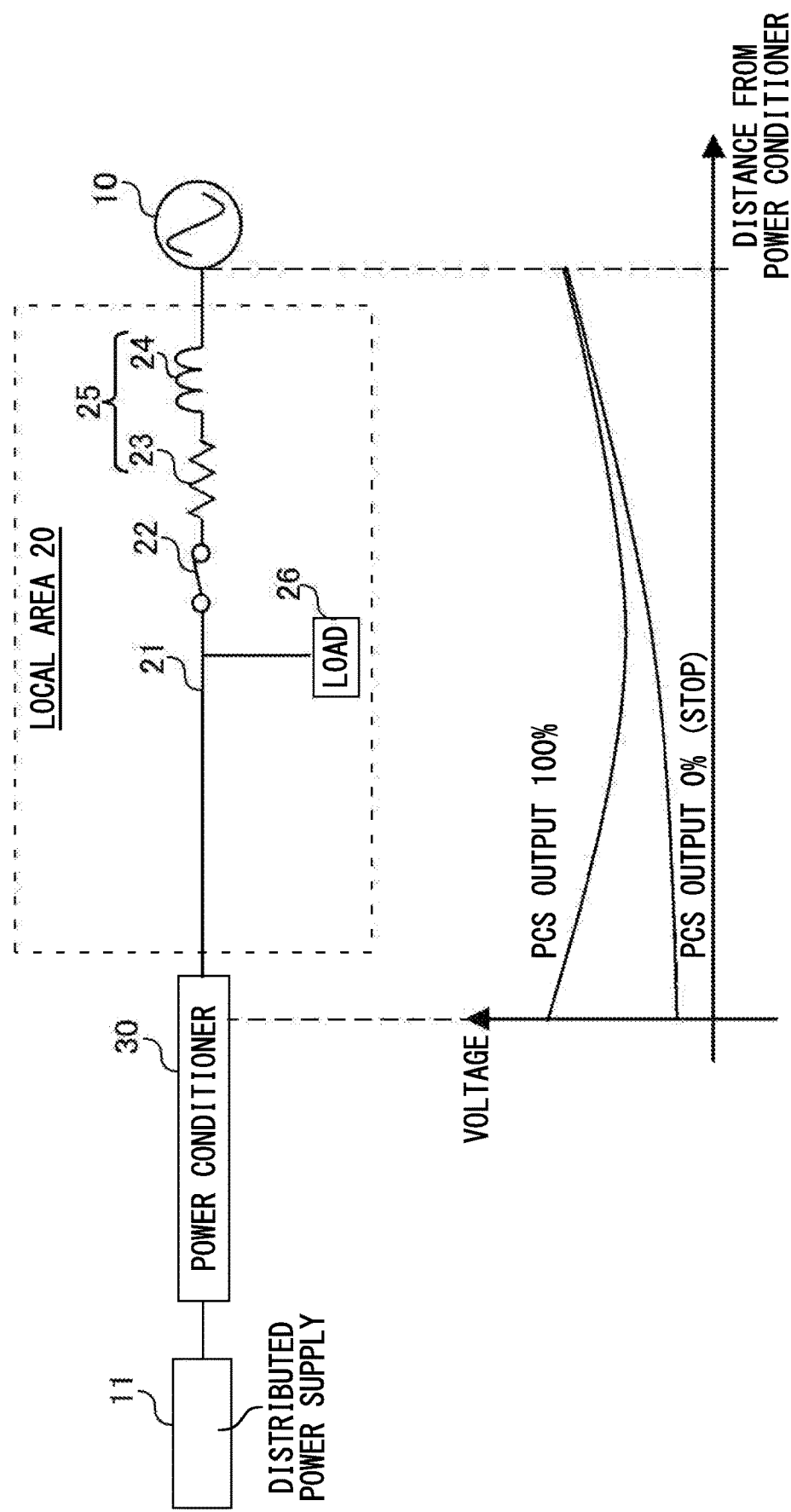
FIG. 6 illustrates one example of a reference compared with a voltage of grid power supply 10 side for determining whether the power source is in the islanding operation state according to the present embodiment.

FIG. 6 is a drawing for explaining one example of the reference compared with the voltage of the grid power supply 10 side according to the present embodiment when it is determined that the power source is in the islanding operation state. In the order from the top, FIG. 6 represents the drawing schematically illustrating each configuration connected between the distributed power supply 11 and the grid power supply 10 and a graph showing the variation in the voltage between the power conditioner 30 and the grid power supply 10. In the lower side graph of FIG. 6, the horizontal axis represents the distance from the power conditioner 30 and the vertical axis represents the voltage. The lower side graph of FIG. 6 shows the change in the voltage between the power conditioner 30 and the grid power supply 10 under the condition where the distributed power supply 11 is not disconnected from the grid power supply 10 side (i) when the output from the power conditioner 30 (PCS) is 100%, i.e., when the power supply amount from the distributed power supply 11 to the system power supply grid power supply 10 side is normal, and (ii) when the output from the power conditioner 30 is 0%, i.e., when the power supply amount from the distributed power supply 11 to the system power supply grid power supply 10 side is zero respectively.

As shown in the lower side graph of FIG. 6, through the power line 21 between the distributed power supply 11 and the grid power supply 10, the system side circuit breaker 22, the line impedance 25 including the resistance 23 and the inductance 24, and the load 26 are intervened between the distributed power supply 11 and the grid power supply 1 so that the voltage decreases even when the power supply amount from the distributed power supply 11 to the system power supply grid power supply 10 side is normal.

Therefore, the graph showing the variation in the voltage when the power supply is normal is like a parabola convex downward. When the power supply amount from the distributed power supply 11 to the system power supply grid power supply 10 side is zero, from the same reason as above, the voltage decreases as the grid power supply 10 approaches the power conditioner 30. Therefore, the graph showing the variation in the voltage when the power supply is zero becomes a quadratic curve in which the voltage increases as the distance from the power conditioner 30 increases.

As one example of the reference compared with the voltage of the grid power supply 10 side when it is determined that the power source is in the islanding operation state, the disconnection processing unit 72 according to the present embodiment uses the voltage value of the grid power supply 10 side detected by the second detection unit 66 in a state in which the distributed power supply 11 is not disconnected from the grid power supply 10 side and there is no supplies of the power from the distributed power supply 11 to the grid power supply 10 side.

That is, as one example, the disconnection processing unit 72 uses the voltage value of the intercept on the vertical axis of the curve when the output by the power conditioner 30 is 0% on the lower side graph of FIG. 6. The disconnection processing unit 72 needs to grasp the voltage value that serves as the reference in advance. The disconnection processing unit 72 may grasp the voltage value that serves as the reference by the second detection unit 66 measuring the voltage of the grid power supply 10 side in advance, for example, when the output from the power conditioner 30 is 0% such as during the time when the solar power generation is not possible, or may grasp the voltage value by acquiring the information on the voltage value that serves as the reference from the electricity supplier.

When the distributed power supply 11 is blocked from the electric power system and the power source is in the islanding operation state, and if the output from the power conditioner 30 is 0%, the voltage of the grid power supply 10 side detected by the second detection unit 66 is equal to or below the reference. Accordingly, even using the reference, the disconnection processing unit 72 according to the present embodiment can correctly determine that the power conditioner 30 is in the islanding operation state.

Various embodiments of the present invention may be described with reference to flowcharts and block diagrams whose blocks may represent (1) stages of processes in which operations are performed or (2) sections of apparatuses responsible for performing operations. Certain stages and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device, such that the computer-readable medium having instructions stored therein comprises an article of manufacture including instructions which can be executed to create means for performing operations specified in the flowcharts or block diagrams. Examples of computer-readable media may include an electronic storage medium, a magnetic storage medium, an optical storage medium, an electromagnetic storage medium, a semiconductor storage medium, etc. More specific examples of computer-readable media may include a floppy disk (registered trademark), a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY® disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA (registered trademark), C++, etc., and conventional procedural programming languages, such as the "C" programming language or similar programming languages.

Computer-readable instructions may be provided to a processor of a general purpose computer, special purpose computer, or other programmable data processing apparatus, or to programmable circuitry, locally or via a local area network (LAN), wide area network (WAN) such as the Internet, etc., to execute the computer-readable instructions to create means for performing operations specified in the flowcharts or block diagrams. Examples of processors include computer processors, processing units, microprocessors, digital signal processors, controllers, microcontrollers, etc.

Figure 7:
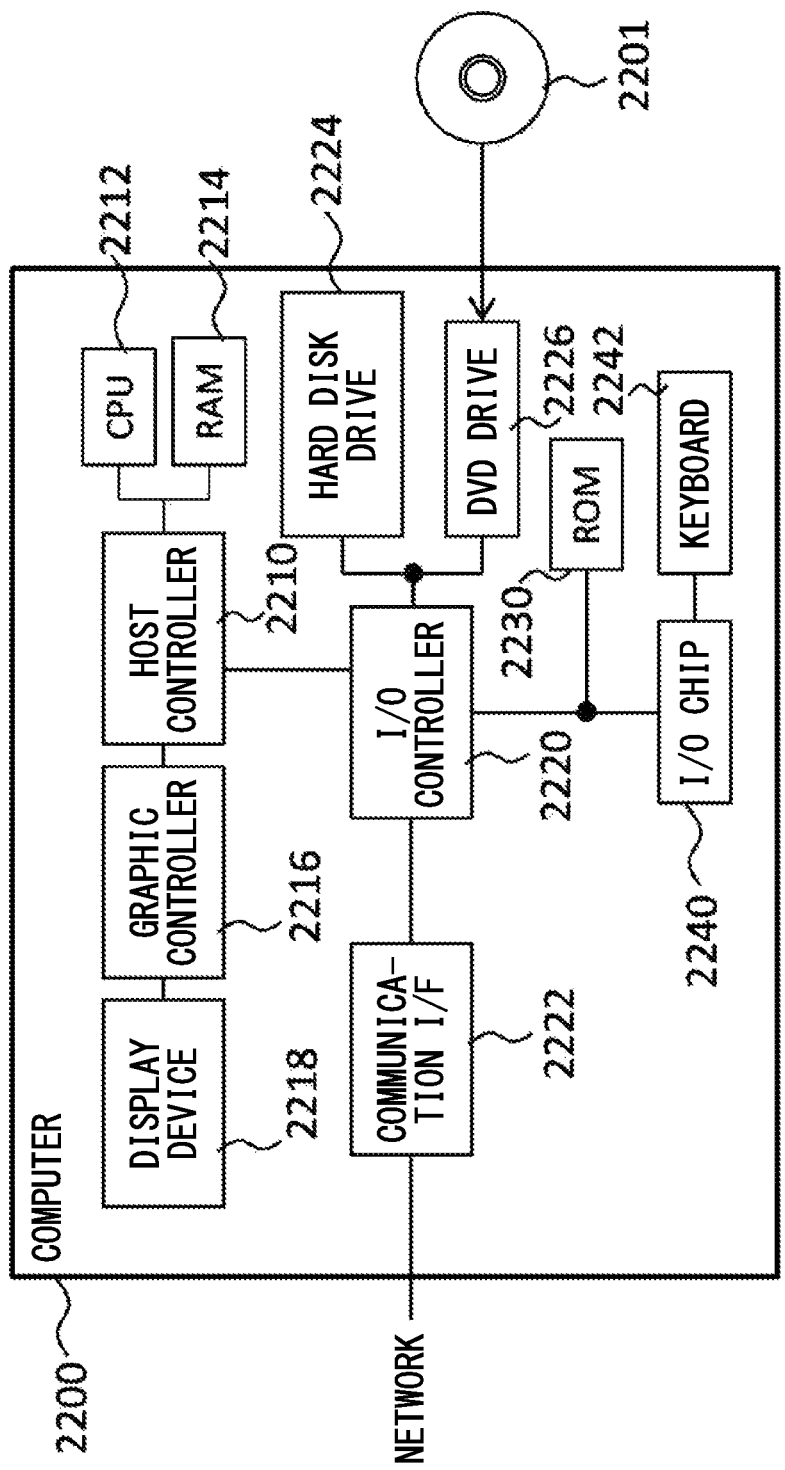
FIG. 7 illustrates one example of a configuration of a computer 2200 according to the present embodiment.

FIG. 7 shows an example of a computer 2200 in which aspects of the present invention may be wholly or partly embodied. A program that is installed in the computer 2200 can cause the computer 2200 to function as or perform operations associated with apparatuses of the embodiments of the present invention or one or more sections thereof, cause the computer 2200 to perform the operation or the one or more sections, and/or cause the computer 2200 to perform processes or stages of the processes of the embodiments of the present invention. Such a program may be executed by the CPU 2212 to cause the computer 2200 to perform certain operations associated with some or all of the blocks of flowcharts and block diagrams described herein.

The computer 2200 according to the present embodiment includes a CPU 2212, a RAM 2214, a graphics controller 2216, and a display device 2218, which are mutually connected by a host controller 2210. The computer 2200 also includes input/output units such as a communication interface 2222, a hard disk drive 2224, a DVD-ROM drive 2226 and an IC card drive, which are connected to the host controller 2210 via an input/output controller 2220. The computer also includes legacy input/output units such as a ROM 2230 and a keyboard 2242, which are connected to the input/output controller 2220 through an input/output chip 2240.

The CPU 2212 operates according to programs stored in the ROM 2230 and the RAM 2214, thereby controlling each unit. The graphics controller 2216 obtains image data generated by the CPU 2212 on a frame buffer or the like provided in the RAM 2214 or in itself, and causes the image data to be displayed on the display device 2218.

The communication interface 2222 communicates with another electronic device via the network. The hard disk drive 2224 stores programs and data used by the CPU 2212 within the computer 2200. The DVD-ROM drive 2226 reads the programs or the data from the DVD-ROM 2201, and provides the hard disk drive 2224 with the programs or the data via the RAM 2214. The IC card drive reads programs and data from an IC card, and/or writes programs and data into the IC card.

The ROM 2230 stores therein a boot program or the like executed by the computer 2200 at the time of activation, and/or a program depending on the hardware of the computer 2200. The input/output chip 2240 may also connect various input/output units via a parallel port, a serial port, a keyboard port, a mouse port, and the like to the input/output controller 2220.

A program is provided by computer readable media such as the DVD-ROM 2201 or the IC card. The program is read from the computer readable media, installed into the hard disk drive 2224, RAM 2214, or ROM 2230, which are also examples of computer readable media, and executed by the CPU 2212. The information processing described in these programs is read into the computer 2200, resulting in cooperation between a program and the above-mentioned various types of hardware resources. An apparatus or method may be constituted by realizing the operation or processing of information in accordance with the usage of the computer 2200.

For example, when communication is performed between the computer 2200 and an external device, the CPU 2212 may execute a communication program loaded onto the RAM 2214 to instruct communication processing to the communication interface 2222, based on the processing described in the communication program. The communication interface 2222, under control of the CPU 2212, reads transmission data stored on a transmission buffering region provided in a recording medium such as the RAM 2214, the hard disk drive 2224, the DVD-ROM 2201, or the IC card, and transmits the read transmission data to a network or writes reception data received from a network to a reception buffering region or the like provided on the recording medium.

In addition, the CPU 2212 may cause all or a necessary portion of a file or a database to be read into the RAM 2214, the file or the database having been stored in an external recording medium such as the hard disk drive 2224, the DVD-ROM drive 2226 (DVD-ROM 2201), the IC card, etc., The CPU 2212 may then write back the processed data to the external recording medium.

Various types of information, such as various types of programs, data, tables, and databases, may be stored in the recording medium to undergo information processing. The CPU 2212 may perform various types of processing on the data read from the RAM 2214, which includes various types of operations, processing of information, condition judging, conditional branch, unconditional branch, search/replace of information, etc., as described throughout this disclosure and designated by an instruction sequence of programs, and writes the result back to the RAM 2214. In addition, the CPU 2212 may search for information in a file, a database, etc., in the recording medium. For example, when a plurality of entries, each having an attribute value of a first attribute associated with an attribute value of a second attribute, are stored in the recording medium, the CPU 2212 may search for an entry matching the condition whose attribute value of the first attribute is designated, from among the plurality of entries, and read the attribute value of the second attribute stored in the entry, thereby obtaining the attribute value of the second attribute associated with the first attribute satisfying the predetermined condition.

The above-explained program or software modules may be stored on the computer 2200 or in the computer readable media near the computer 2200. In addition, a recording medium such as a hard disk or a RAM provided in a server system connected to a dedicated communication network or the Internet can be used as the computer readable media, thereby providing the program to the computer 2200 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

For example, the power conditioner 30 described above has various configurations and functions described above. Alternatively, the power conditioner 30 may be configured to not include a part of various configurations and functions described above when needed.

For example, when the detection device 60 of the power conditioner 30 does not have functions of receiving the instruction from the communication equipment of the electricity supplier, sending the warning signal to the communication equipment of the electricity supplier, transmitting the instruction to another power conditioner 31, and sending the warning signal to the communication equipment of the emergency power 28, the power conditioner 30 may not include the communication unit 78.

Further, for example, the power processing unit 71 may increase the charging power to the power storage device connected between the distributed power supply 11 and the grid power supply 10 side so that the power supply amount from the distributed power supply 11 to the system power supply grid power supply 10 side is reduced. Increasing the charging power to the power storage device may include any methods such as storing the electricity in the power storage device, storing the energy in the power storage device, and electrically generating hydrogen in the power storage device. Increasing the charging power to the power storage device may include any methods such as newly starting charging from the distributed power supply 11 to the power storage device and since before the possibility of the islanding operation is detected, additionally increasing the power supply amount to the power storage device supplied with the power from the grid power supply 10 and the distributed power supply 11. In any case, as compared to the case where the power supply amount is reduced by discharging the current from the distributed power supply 11 to the ground connected to the power conditioner 30, the power generated by the distributed power supply 11 may be effectively used.

Further, for example, the disconnection processing unit 72 may determine to disconnect the distributed power supply 11 from the grid power supply 10 side if the amount of change per unit time of the voltage of the grid power supply 10 side with the power supply amount having been changed is equal to or greater than the reference. If the power supply amount from the distributed power supply 11 to the system power supply grid power supply 10 side is changed under the condition where the distributed power supply 11 is in the islanding operation state, as compared to when the distributed power supply 11 is not in the islanding operation state, it is considered that the amount of change per unit time of the voltage of the grid power supply 10 side becomes large. Therefore, the disconnection processing unit 72 may determine whether to disconnect the distributed power supply 11 from the grid power supply 10 side by using the value of the amount of change per unit time of the voltage of the grid power supply 10 side above the reference when the distributed power supply 11 is in the islanding operation state and the value that is equal to or below the reference when the distributed power supply 11 is not in the islanding operation state.

For example, the power processing unit 71 may gradually change the power supply amount from the distributed power supply 11 to the system power supply grid power supply 10 side in response to the detection that the distributed power supply 11 may be in the islanding operation. In this case, the power processing unit 71 may maximally use the regulated time from when the distributed power supply 11 starts the islanding operation to when the distributed power supply 11 is disconnected from the electric power system, for example, in the case of the high voltage, the regulated time of 1 sec at the time of filing the present application (at the time of filing the present application, to reduce the injection amount per unit time of the reactive power that is the cause of the fluctuation, it is proposed to revise the regulated time from 2 sec to 3 sec), and gradually decrease the power supply amount from the distributed power supply 11 to the grid power supply 10 side. In other word, after the distributed power supply 11 is in the islanding operation state, the power conditioner 30 detects the suspicion of the islanding operation of the distributed power supply 11, and may gradually decrease the power supply amount from the distributed power supply 11 to the system power supply grid power supply 10 side by using the remaining time obtained by subtracting, from the above-mentioned regulated time, the time required to start the change of the power supply amount from the distributed power supply 11 to the system power supply grid power supply 10 side.

In JEAC9701-2016 by Japan Electric Association (system connection regulation), after the occurrence of the islanding operation, it is necessary for PCS to stop the output, open the contactor, and disconnect from the system within the regulated time. In the case of Standard type islanding operation detection method employed by the power conditioner 30 of the present embodiment, the above-mentioned required time is substantially the same as the time from when the distributed power supply 11 is in the islanding operation state to when the power conditioner 30 detects the suspected islanding operation of the distributed power supply 11, and at the time of filing the present application, is about 200 msec.

The power conditioner 30 sends the warning signal to the communication equipment of the emergency power 28 and gradually changes the power supply amount from the distributed power supply 11 to the system power supply grid power supply 10 side in response to the detection that the distributed power supply 11 may be in the islanding operation so that the load 26 is mainly operated with the power supplied from the distributed power supply 11 when the distributed power supply 11 is in the islanding operation state. Accordingly, the time for switching the power supply source to the load 26 to the emergency power 28 can be ensured before the power conditioner 30 disconnects the distributed power supply 11 from the grid power supply 10 side.

For example, in the above embodiments, it has been explained that the second warning processing unit 76 sends the warning signal to warn that the distributed power supply 11 side may be disconnected from the grid power supply 10 side when the variation of the power supply amount by the power conditioner 30 in response to the detection that the distributed power supply 11 may be in the islanding operation is equal to or greater than the reference. Alternatively, the second warning processing unit 76 may send the above-mentioned warning signal when it is detected that the distributed power supply 11 may be in the islanding operation, when the power processing unit 71 injects the reactive power to the power path via the power conversion unit 40, or when the voltage of the grid power supply 10 side that is changed according to the change in the power supply amount by the power conditioner 30 in response to the detection that the distributed power supply 11 may be in the islanding operation is equal to or below the preliminary reference. The preliminary reference is used by the above-described disconnection processing unit 72 to determine to disconnect the distributed power supply 11 from the grid power supply 10 side and is a reference whose voltage is higher than the reference for the comparison with the voltage of the grid power supply 10 side with the power supply amount is reduced. In any case, the second warning processing unit 76 may send the warning signal at a timing earlier than the timing at which the voltage of the grid power supply 10 side changes by following the change in the power supply from the power conditioner 30 to the grid power supply 10 side, and, by the time when the power conditioner 30 in the islanding operation state stops supplying the power to the load 26, it is possible to ensure the time for safely stopping the operation of the load 26 and switching the power supply source to the load 26 to the emergency power 28.

When the warning signal is sent if the power processing unit 71 injects the reactive power to the power path via the power conversion unit 40, since the fluctuation at the power path frequently occurs, it is considered that the frequency of sending the warning signal becomes high. If the frequency of sending the warning signal becomes high, the frequency of activating the emergency power 28 becomes high, and thus, the cost caused by using the emergency power 28 may become high and the rechargeable battery of the emergency power 28 may be consumed. By considering these problems, it is preferable to adjust the conditions for sending the warning signal.

Further, for example, the power processing unit 71 may change the power supply amount from the distributed power supply 11 to the system power supply grid power supply 10 side in response to the fact that it is detected that the distributed power supply 11 may be in the islanding operation a plurality of times within the predetermined period. In other word, the power processing unit 71 may change the power supply if the event of suspecting that the power source is in the islanding operation state occurs a plurality of times within the certain period by injecting the reactive power. Accordingly, the frequency in which the power conditioner 30 changes the output can be reduced and the frequency of the occurrence of the fluctuation at the power path may be reduced.

For example, in the above embodiments, it is explained that the power processing unit 71 reduces the power supply amount from the distributed power supply 11 to the system power supply grid power supply 10 side in response to the detection that the distributed power supply 11 may be in the islanding operation. Alternatively, the power processing unit 71 may change the power supply by repeatedly increasing and decreasing the power supply amount from the distributed power supply 11 to the system power supply grid power supply 10 side within the range of the rated voltage in response to the detection that the distributed power supply 11 may be in the islanding operation. In this case, the disconnection processing unit 72 may determine whether to disconnect the distributed power supply 11 from the grid power supply 10 side based on the change on the voltage of the grid power supply 10 side with the power supply amount having been changed, i.e., more specifically, based on whether the voltage of the grid power supply 10 side repeatedly increases or decreases following the power supply amount that repeatedly increases and decreases. In this case, the disconnection processing unit 72 may determine to disconnect the distributed power supply 11 from the grid power supply 10 side if the voltage of the grid power supply 10 side repeatedly increases or decreases by following the power supply that repeatedly increases or decreases. The method is different from the active power fluctuation method that applies the periodic active power fluctuation to the PCS output and detects the periodic voltage change that appears at the time of the transition to the islanding operation in that, since before at least the suspicion of the islanding operation is detected, the periodic active power fluctuation is not given to the PCS output.

As described above, when the power processing unit 71 repeatedly increases or decreases the power supply amount from the distributed power supply 11 to the system power supply grid power supply 10 side within the range of the rated voltage and then, determines not to disconnect the distributed power supply 11 from the grid power supply 10 side in response to the detection that the distributed power supply 11 may be in the islanding operation, the power processing unit 71 may stop decreasing or increasing the power supply amount from the distributed power supply 11 to the system power supply grid power supply 10 side and return a state of the voltage supply amount to a state in which the voltage supply amount is not yet decreased or increased.

For example, when the load 26 is the motor, the motor that is blocked from the electric power system and receives the reduced power supply from the distributed power supply 11 may generate the regeneration power, the decrease of the voltage of the grid power supply 10 side is unlikely to occur, and the power conditioner 30 may unlikely to detect the islanding operation state of the distributed power supply 11. Therefore, when the load 26 is the motor, the power conditioner 30 may reduce the power supply amount from the distributed power supply 11 to the system power supply grid power supply 10 side and send the instruction to stop the output of the regeneration power to the motor. Further, in this case, the first warning processing unit 75 may add, to the warning signal indicating the occurrence of the erroneous detection, the information on the load 26, for example, the information indicating that the load 26 is the motor, and send the thus obtained signal.

The operations, procedures, steps, and stages of each process performed by an apparatus, system, program, and method shown in the claims, the specification, or diagrams can be performed in any order as long as the order is not illustrates by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

1 Interconnection of power system, 10 Grid power supply, 11, 13 Distributed power supply, 15 Communication network, 20 Local area, 21 Power line, 22 System side circuit breaker, 23 Resistance, 24 Inductance, 25 Line impedance, 26 Load, 28 Emergency power, 30, 31 Power conditioner, 40 Power conversion unit, 42 Inverter, 44 Inverter control unit, 50 Interconnection relay, 60 Detection device, 61 Control unit, 63 First detection unit, 64 Storage unit, 66 Second detection unit, 71 Power processing unit, 72 Disconnection processing unit, 73 Command processing unit, 75 First warning processing unit, 76 Second warning processing unit, 78 Communication unit, 90 Current detection unit, 2200 Computer, 2201 DVD-ROM, 2210 Host controller, 2212 CPU, 2214 RAM, 2216 Graphics controller, 2218 Display device, 2220 Input/output controller, 2222 Communication interface, 2224 Hard disk drive, 2226 DVD-ROM drive, 2230 ROM, 2240 Input/output chip, 2242 Keyboard

What is claimed is:

1. A detection device comprising:
    a first detection unit that detects whether a power source connected to a system is possibly in an islanding operation based on a frequency of a power supplied from the power source;
    a power processing unit that changes an active power from the power source to the system in response to that the first detection unit having detected that the power source may be in an islanding operation;
    a second detection unit that detects a voltage of the system with the active power having been changed; and
    a disconnection processing unit that disconnects the power source from the system in response to the second detection unit having detected a lowering of the voltage of the system with the active power having been changed, wherein
    the system has an output voltage lower than an output voltage of the power source at least when the first detection unit had detected that the power source may be in the islanding operation.

2. The detection device according to claim 1, wherein the power processing unit changes the active power from the power source to the system by increasing power for charging a power storage device connected between the power source and the system.

3. The detection device according to claim 1, wherein the disconnection processing unit disconnects the power source from the system when the output voltage of the system becomes equal to or below a reference voltage.

4. The detection device according to claim 3, wherein the reference voltage is a voltage value in accordance with a settling value of under voltage that is predesignated by an electricity supplier of the system to a load to which power is supplied from the system.

5. The detection device according to claim 3, wherein the reference voltage is a voltage value of the system detected by the second detection unit when the power source is not disconnected from the system and power is not supplied from the power source to the system.

6. The detection device according to claim 1, wherein the disconnection processing unit disconnects the power source from the system if an amount of a change per unit time in the output voltage of the system with the active power having been changed is equal to or greater than a reference voltage.

7. The detection device according to claim 1, wherein the power processing unit returns a state of the active power to a state before the changing when the disconnection processing unit determines not to disconnect the power source from the system.

8. The detection device according to claim 7, further comprising:
    a first warning processing unit that sends a warning signal when the disconnection processing unit determines not to disconnect the power source from the system.

9. The detection device according to claim 8, wherein the first warning processing unit acquires a waveform of the frequency of the power supplied from the power source that has caused the change in the active power and appends the waveform of the frequency to the warning signal.

10. The detection device according to claim 1, wherein the power processing unit gradually changes the active power from the power source to the system.

11. The detection device according to claim 1, further comprising:
    a warning processing unit that sends a warning signal to warn a possibility of disconnecting the power source from the system under one of the following conditions: that the first detection unit detects that the power source may be in the islanding operation, or a fact that a variation of the active power that is changed in response to that the first detection unit detecting that the power source may be in the islanding operation becomes equal to or greater than a reference voltage.

12. The detection device according to claim 1 wherein, the power processing unit changes the active power from the power source to the system a plurality of times within a predetermined period in response to the first detection unit having detected that the power source may be in the islanding operation.

13. The detection device according to claim 1 further comprising:
    an instruction processing unit that transmits an instruction for changing the active power from another power source connected to the system to a power converter that is provided between the another power source and the system in response to the first detection unit having detected that the power source may be in the islanding operation in association with a change in the active power by the power processing unit.

14. A power conditioner comprising:
    the detection device according to claim 1; and
    a power conversion unit that converts power output from the power source into an AC current corresponding to a power source of the system.

15. A detection method comprising:
  detecting whether a power source connected to a system may be in an islanding operation based on a frequency of a power supplied from the power source;
  changing an active power from the power source to the system in response to a detection that the power source may be in an islanding operation;
  detecting a voltage of the system with the active power having been changed; and
  disconnecting the power source from the system in response to a detection of a lowering of the voltage of the system with the active power having been changed, wherein
  the system has an output voltage lower than an output voltage of the power source at least when the first detection unit had detected that the power source may be in the islanding operation.

16. A computer readable storage medium that stores a computer program for causing a computer to execute:
  detecting whether a power source connected to a system may be in an islanding operation based on a frequency of a power supplied from the power source;
  changing an active power from the power source to the system in response to a detection that the power source may be in the islanding operation;
  detecting a voltage of the system with the active power having been changed; and
  disconnecting the power source from the system in response to a detection of a lowering of the voltage of the system with the active power having been changed, wherein
  the system has an output voltage lower than an output voltage of the power source at least when the first detection unit had detected that the power source may be in the islanding operation.

\* \* \* \* \*